United States Patent

Geffken et al.

[11] Patent Number: 5,985,762
[45] Date of Patent: Nov. 16, 1999

[54] METHOD OF FORMING A SELF-ALIGNED COPPER DIFFUSION BARRIER IN VIAS

[75] Inventors: Robert M. Geffken, Burlington; Stephen E. Luce, Underhill, both of Vt.

[73] Assignee: International Business Machines Corporation, Armonk, N.Y.

[21] Appl. No.: 08/858,139

[22] Filed: May 19, 1997

[51] Int. Cl.⁶ .................................................. H01L 21/283
[52] U.S. Cl. .......................... 438/687; 438/627; 438/639; 438/643; 438/653
[58] Field of Search .................................... 438/687, 627, 438/628, 637–639, 643–645, 648, 653, 654, 656, 691

[56] References Cited

U.S. PATENT DOCUMENTS

| | | |
|---|---|---|
| 4,702,792 | 10/1987 | Chow et al. . |
| 4,789,648 | 12/1988 | Chow et al. . |
| 4,954,142 | 9/1990 | Carr et al. . |
| 5,008,217 | 4/1991 | Case et al. . |
| 5,081,064 | 1/1992 | Inoue et al. ............................... 438/625 |
| 5,098,860 | 3/1992 | Chakravorty et al. ................... 438/628 |
| 5,176,790 | 1/1993 | Arleo et al. . |
| 5,447,599 | 9/1995 | Li et al. . |
| 5,474,651 | 12/1995 | Huebner ................................. 438/631 |
| 5,674,787 | 10/1997 | Zhao et al. ............................... 438/627 |
| 5,759,906 | 6/1998 | Lou .......................................... 438/623 |
| 5,770,519 | 6/1998 | Klein et al. ............................. 438/639 |
| 5,814,557 | 9/1998 | Venkatraman et al. ................. 438/622 |

OTHER PUBLICATIONS

T. Mori et al., Metal Capped Cu Interconnection Technology by Chemical Mechanical Polishing; VMIC Conference; Jun. 18–20, 1996; pp. 487–492.

T. Gravier, et al., Copper Contamination Effects in 0.5 μm BiCMOS Technology; VMIC Conference; Jun. 18–20, 1996; pp. 327–329.

*Primary Examiner*—John F. Niebling
*Assistant Examiner*—Ha Tran Nguyen
*Attorney, Agent, or Firm*—Whitham, Curtis & Whitham; Howard J. Walter

[57] ABSTRACT

A copper diffusion barrier is formed on the side walls of vias connected to copper conductors to prevent copper diffusion into inter-level dielectric. A thin film of copper diffusion barrier material is deposited on the wafer post via etch. A sputter etch is performed to remove barrier material from the base of via and to remove copper oxide from the copper conductor. The barrier material is not removed from the sidewall during the sputter etch. Thus, a barrier to re-deposited copper is formed on the via sidewalls to prevent copper poisoning of the dielectric.

12 Claims, 2 Drawing Sheets

METHOD OF FORMING A SELF-ALIGNED COPPER DIFFUSION BARRIER IN VIAS

BACKGROUND OF THE INVENTION

1. Field of the Invention

The present invention generally relates to computer chip manufacture and, more particularly, to providing copper wire connections without the copper poisoning inter-level dielectric oxide or bulk silicon.

2. Background Description

Forming wires and vias for connections can be done by a variety of methods. Typically, a substrate is covered with an insulator which is patterned for wires and vias. Metal is then deposited and any metal overlying the insulator is removed by chemical-mechanical polish (CMP). This process is known in the art as a damascene process.

The use of copper wires in computer chip manufacture is desirable because copper has a lower resistivity than aluminum and makes a better conductor. However, copper wiring requires special care in the production process. Copper requires an adhesion layer, thus adding steps to the production. In addition, copper diffuses easily through silicon and oxide, so a diffusion barrier between the copper wire and the silicon dioxide insulator is also required.

When forming vias to provide connection to copper wires, an argon sputter is performed as the first step prior to the metal deposition to fill the via. The purpose of the argon sputter is to remove the copper oxide from the copper wire below the via. Copper and copper oxide will be re-deposited on the via sidewalls during this argon sputter creating the possibility of copper diffusing into the oxide, poisoning it and degrading its electrical insulating capability.

Copper-insulator wiring structures can be formed by damascene or dual-damascene processes. One damascene level is fabricated by the deposition of planar dielectric stack which is then patterned and etched using standard lithographic and dry etch techniques to produce the wiring or via pattern. Metal deposition takes place next. Then, chemical-mechanical polishing is used to remove the field metal leaving the planarized wiring and via imbedded in the insulator. Subsequent levels are formed by repeating the above steps. In the damascene process all wiring is planar at each level. An adhesion layer and diffusion barrier is necessary in copper structures and is typically placed under the copper layers.

SUMMARY OF THE INVENTION

It is therefore an object of the present invention to provide a method of preventing copper poisoning of inter-level dielectric oxide or other insulators.

It is another object of the present invention to provide an improved method of constructing a copper multilevel interconnection structure.

It is further object of the present invention to provide a dual damascene method of constructing a multi-level copper wire structure.

According to the invention, a thin film of material is deposited on the wafer post via etch. This material must have the property of preventing copper from diffusing into the insulator. An argon sputter etch is performed to remove copper oxide from the copper wire the via is contacting. The barrier material is removed from the bottom of the via and top surface of the wafer along with the copper oxide during this step. The barrier material is not removed from the sidewall during the sputter etch. Thus, any sputtered re-deposited copper on the via sidewalls is prevented from diffusing into the insulator. The adhesion and copper diffusion barrier layers are immediately deposited so that the cleaned copper surface is not exposed to an oxidizing ambient.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
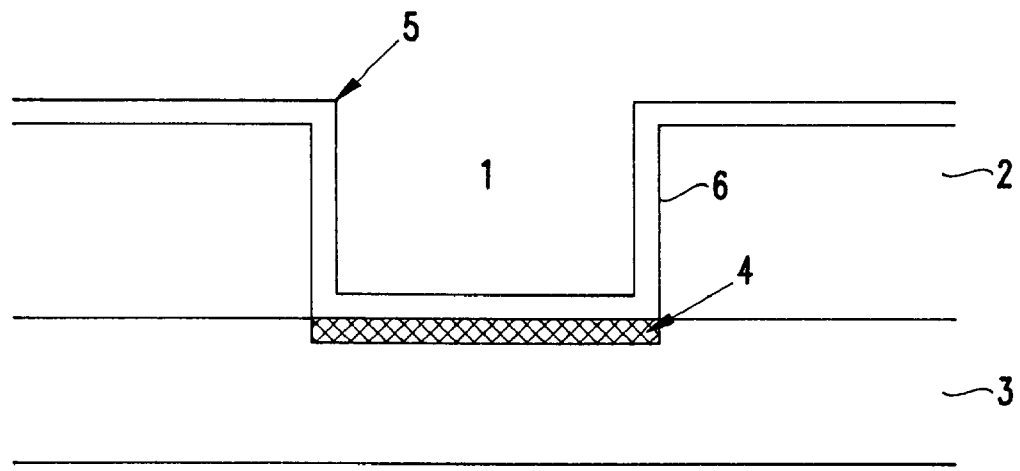
FIG. 1 is a cross-sectional view of a via with barrier material deposited.

Referring now to the drawings, and more particularly to FIG. 1, there is shown a via 1 which has been formed in inter-level dielectric (ILD) 2 over a copper wire 3. This structure may be part of a semiconductor device. As a result of the etch process which forms the via 1 in the ILD 2, copper oxide 4 forms on the exposed surface of the copper wire 3. The copper oxide 4 must be removed to provide a satisfactory electrical connection to the copper wire 3. In preparation for removal of the copper oxide 4, this invention includes the step of depositing a barrier material 5 over the surfaces of the top surface of the ILD 2, the sidewalls 6, and the copper oxide 4. The barrier material may be a metallic or insulating material and is specifically chosen to provide a diffusion barrier for copper. Suitable metallic materials which may be used as the barrier material include tantalum (Ta), titanium nitride (TiN), tantalum nitride (TaN), tungsten nitride (WN), tungsten silicon nitride (TiSN), and tantalum silicon nitride (TaSiN). Insulating materials, such as silicon nitride ($Si_3N_4$), may also be used as the barrier. The chief requirement for the barrier layer is that it prevent copper and copper oxide from coming into contact with the oxide or "ILD" during directional etch and allowing the via to be filled with copper after etching without copper coming into contact with the ILD.

Figure 2:
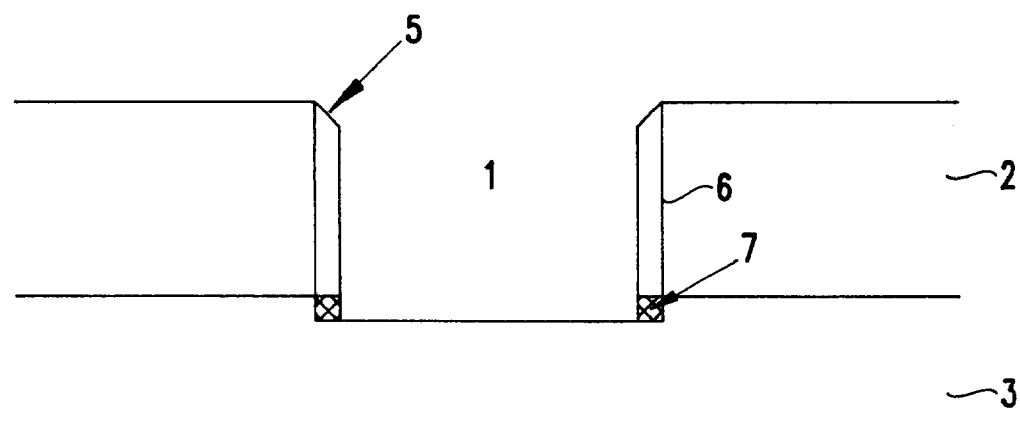
FIG. 2 is a cross-sectional view of the via following etching of the barrier material on the surface of the dielectric and in the base of the via, as well as etching of the copper oxide.

After deposition of the barrier material 5, a directional etch removes barrier material 5 from the top surface of the ILD 2, and removes both the barrier material 5 and copper oxide 3 from the base of the via 1. However, as shown in FIG. 2, the barrier material 5 remains on the sidewalls 6 of the via. This is due to the directional nature of the etch. Because the barrier material 5 remains in place on the sidewalls 6, it keeps copper and copper oxide from coming into contact with the ILD 2 during directional etch. FIG. 2 shows a small amount of copper oxide 7 will remain at the bottom edges of the via. This copper oxide 7 will not have any affect on the contact to the clean copper wire 3 or the ILD 2. The via shown in FIG. 2 is ready to be filled with metal. An additional adhesion barrier material is deposited and this is followed by copper deposition. Filling with the adhesion/barrier and copper should occur before copper wire 3 has a chance to re-oxidize.

Figure 3A:
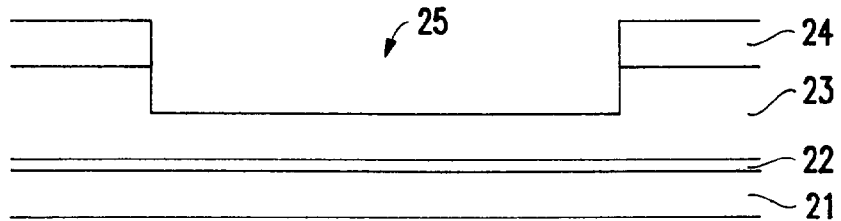
FIGS. 3A to 3E are cross-sectional views illustrating a dual damascene structure as it is constructed.

FIGS. 3A to 3E show cross-sectional views of the steps for constructing a dual damascene structure using the principles of this invention. In FIG. 3A, there is shown a copper wire 21 overlayed with a silicon nitride ($Si_3N_4$) barrier 22. The copper wire 21 is an element of the multi-level metal chip wiring which connects underlying semiconductor devices to external packages, substrates, etc. Over the silicon nitride barrier 22 is an insulator 23, which may be composed of silicon dioxide ($SiO_2$), a fluorinated silicate ($SiO_xF_y$), spun on glass (SOG), polymers, aerogels, parylenes, teflons, diamond like carbon (DLC), etc., or composites of these materials. A resist mask 24 partially covers the insulator 23. As can be seen in FIG. 3a, the insulator 23 has been partially etched through an opening 25 in the resist 24. This etching represents a space to provide for a new copper wire in a plane parallel to the plane of the copper wire 21 shown. The insulator is etched part way to form opening 25 which will contain the copper line conductor.

Figure 3B:
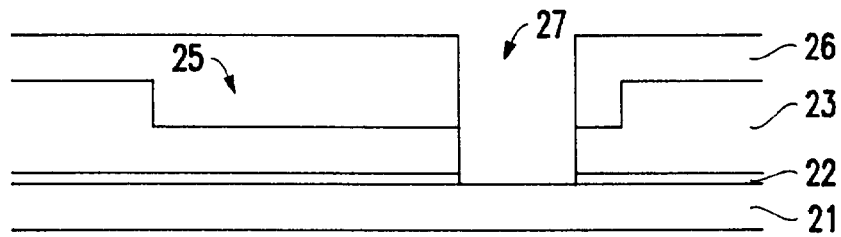

Resist 24 is then stripped, and the next step is to apply another layer of resist 26 and expose and develop it in a via pattern. FIG. 3b shows the resist is exposed with a mask using standard photolithography techniques and then developed to form via images in the resist. As shown in FIG. 3B, a via 27 is etched down to the copper wire 21. This via 27 will provide the connection between the copper wire 21 and a second copper wire which will be formed in opening 25.

Figure 3C:
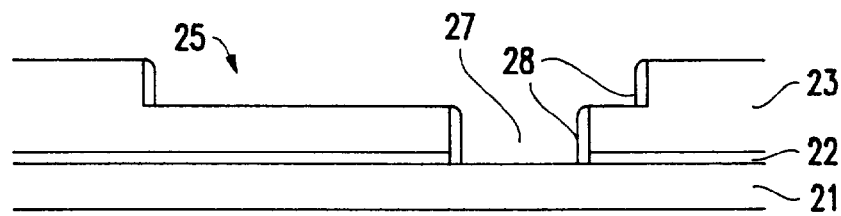

Next, as shown in FIG. 3C, the resist 26 is removed and a barrier material 28 deposited on all surfaces. Following deposition of barrier material 28, the barrier material 28 is directionally etched to remove it from all but the vertical sidewalls of the wire space 25 and via 27. This step provides a built in protection for the insulator 23 from sputtered copper and copper oxide during directional etching since the barrier material 28 on the side walls blocks contact with the insulator. Thus copper poisoning is prevented.

Figure 3D:
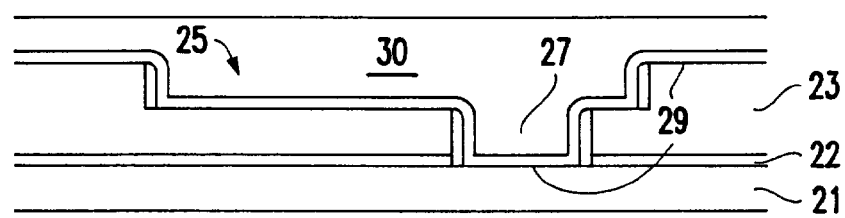
Figure 3E:
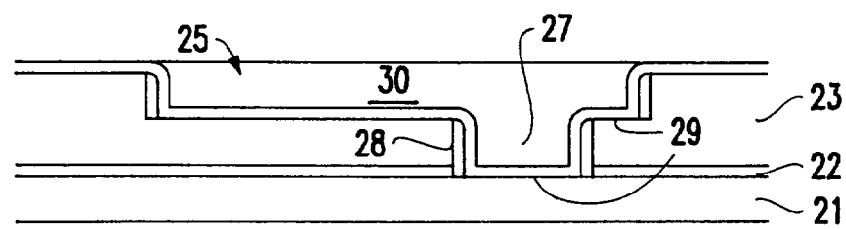

Next, as shown in FIG. 3D the exposed wire and via space surfaces are lined with a metallic adhesion and diffusion barrier layer 29, such as tantalum, tantalum nitride, titanium nitride, tungsten nitride, tungsten silicon nitride, or tantalum silicon nitride, and then filled with copper 30. These steps should be performed before the copper 30 re-oxidizes. The adhesion layer can be the same or different from the barrier layer. In some applications, it may be advantageous to have the barrier/adhesion layer 29 be a conducting material and the barrier layer 28 be an insulating material. For example, the barrier layer 28 could be silicon nitride, while the adhesion layer could be tantalum, tantalum nitride, titanium nitride, tungsten nitride, tungsten silicon nitride, or tantalum silicon nitride. The copper fill is followed by a chemical mechanical polish (CMP) which completes formation of the dual damascene line/via structure as shown in FIG. 3E. Another line via level (not shown) can be added by depositing silicon nitride, insulator, and a mask and following the previously described steps.

In summary, copper diffuses into silicon dioxide ($SiO_2$) and silicon very rapidly and also does not adhere well to $SiO_2$. However, copper has advantageous electrical properties for use in multilevel structures. This invention overcomes the problem of copper poisoning by providing a barrier layer on the side walls of the $SiO_2$ or other insulator that serves as both an adhesion layer and copper diffusion barrier.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A method of preventing copper poisoning while fabricating an integrated circuit structure, comprising the steps of:

etching a via through a dielectric layer to a copper conductor positioned in a substrate;

depositing a barrier material over said dielectric layer and into said via over said copper conductor, said barrier material covering sidewalls of said via, said barrier material being selected to prevent diffusion of copper therethrough;

directionally etching said substrate to remove said barrier material from a top of said dielectric layer and a bottom region of said via and leave said barrier material on said sidewalls of said via, said copper conductor being etched during said directionally etching step; and filling said via with a conductor.

2. The method of claim 1 wherein said conductor used in said filling step comprises an adhesion/barrier layer applied to said barrier material and copper applied to said adhesion/barrier layer is copper.

3. The method of claim 1 wherein said filling step is performed prior to oxidation of said copper conductor.

4. The method of claim 1 wherein said step of directionally etching is performed by sputtering.

5. The method of claim 1 wherein said barrier material deposited is selected from the group consisting of tantalum, titanium nitride, silicon nitride, tantalum nitride, tungsten nitride, tungsten silicon nitride, and tantalum silicon nitride.

6. The method of claim 1 further comprising the step of planarizing said substrate after said step of filling.

7. The method of claim 6 wherein said step of planarizing is performed by chemical-mechanical polishing.

8. The method of claim 1 wherein said filling step includes the steps of:

depositing an adhesion/barrier layer on said barrier material; and then depositing copper on said adhesion barrier layer.

9. The method of claim 8 wherein said adhesion/barrier layer is a metallic conductor.

10. The method of claim 9 wherein said metallic conductor is selected from the group consisting of tantalum, titanium nitride, tantalum nitride, tungsten nitride, tungsten silicon nitride, and tantalum silicon nitride.

11. The method of claim 1 further comprising the step of etching a second via in said dielectric layer, said second via being contiguous with and wider than said via etched through said dielectric layer during said first etching step, but said second via not extending through said dielectric layer, and wherein said depositing step deposits barrier material on sidewalls of said second via.

12. The method of claim 11 further comprising the step of coating sidewalls and a bottom region of said second via, and sidewalls and a bottom of said via etched through said dielectric layer during said first etching step with an adhesion/barrier layer after said directionally etching step and prior to said filling step.

* * * * *